United States Patent [19]

Niki et al.

[11] Patent Number: 4,680,540
[45] Date of Patent: Jul. 14, 1987

[54] DEVICE FOR MEASURING AVERAGE FREQUENCIES

[75] Inventors: Shoji Niki, Kitaadachi; Toshiro Takahashi; Yohei Hirakoso, both of Gyoda, all of Japan

[73] Assignee: Takeda Riken Kogyo Kabushikikaisha, Tokyo, Japan

[21] Appl. No.: 629,791

[22] Filed: Jul. 11, 1984

[30] Foreign Application Priority Data

Jul. 18, 1983 [JP] Japan ................... 58-131345

[51] Int. Cl.$^4$ ............................................. G01R 23/02
[52] U.S. Cl. ................................ 324/78 R; 324/78 D
[58] Field of Search ................. 324/76 R, 77 A, 77 B, 324/77 D, 78 R, 78 D, 78 E, 79 R, 79 D

[56] References Cited

U.S. PATENT DOCUMENTS

| | | | |
|---|---|---|---|
| 3,909,715 | 9/1975 | Oda | 324/78 R |
| 4,051,433 | 9/1977 | Dimotakis | 324/78 R |
| 4,310,795 | 1/1982 | Fremery | 324/78 D |
| 4,424,482 | 1/1984 | Drogin | 324/79 D |
| 4,468,614 | 8/1984 | Takahashi | 324/78 D |
| 4,609,990 | 9/1986 | Sember | 324/78 D |

*Primary Examiner*—Michael J. Tokar
*Attorney, Agent, or Firm*—Staas & Halsey

[57] ABSTRACT

A synchronizing gate signal is generated in synchronism with an input signal or a clock signal, and first and second gates are opened by the synchronizing gate signal. The input signal having passed through the first gate is counted by a first counter circuit, and the clock signal having passed through the second gate is frequency-divided by a divide-by-$10^n$ frequency divider. An output from the frequency divider is counted by a second counter means. The synchronizing gate signal is generated under the control of a control circuit, and is prevented from being generated when the output from the frequency divider is applied to the control circuit. The n in the frequency-division ratio $1/10^n$ of the frequency divider and a maximum count P of a third counter circuit are determined from a count of the third counter circuit, a preset measurement accuracy, and a period of the clock signal at the time one output is produced from the frequency divider, the n being set in the frequency divider. The control circuit is caused to generate the synchronizing gate signal. When the output from the frequency divider is obtained, the count is picked up from the first counter circuit and the synchronizing gate signal is generated again in a repetitive process. Each time the output from the frequency divider is obtained, an average frequency is calculated from the counts of the first counter circuit and the second counter circuit. Until the count of the second counter circuit reaches P, a display indicates that a displayed average frequency has the preset measurement accuracy.

22 Claims, 19 Drawing Figures

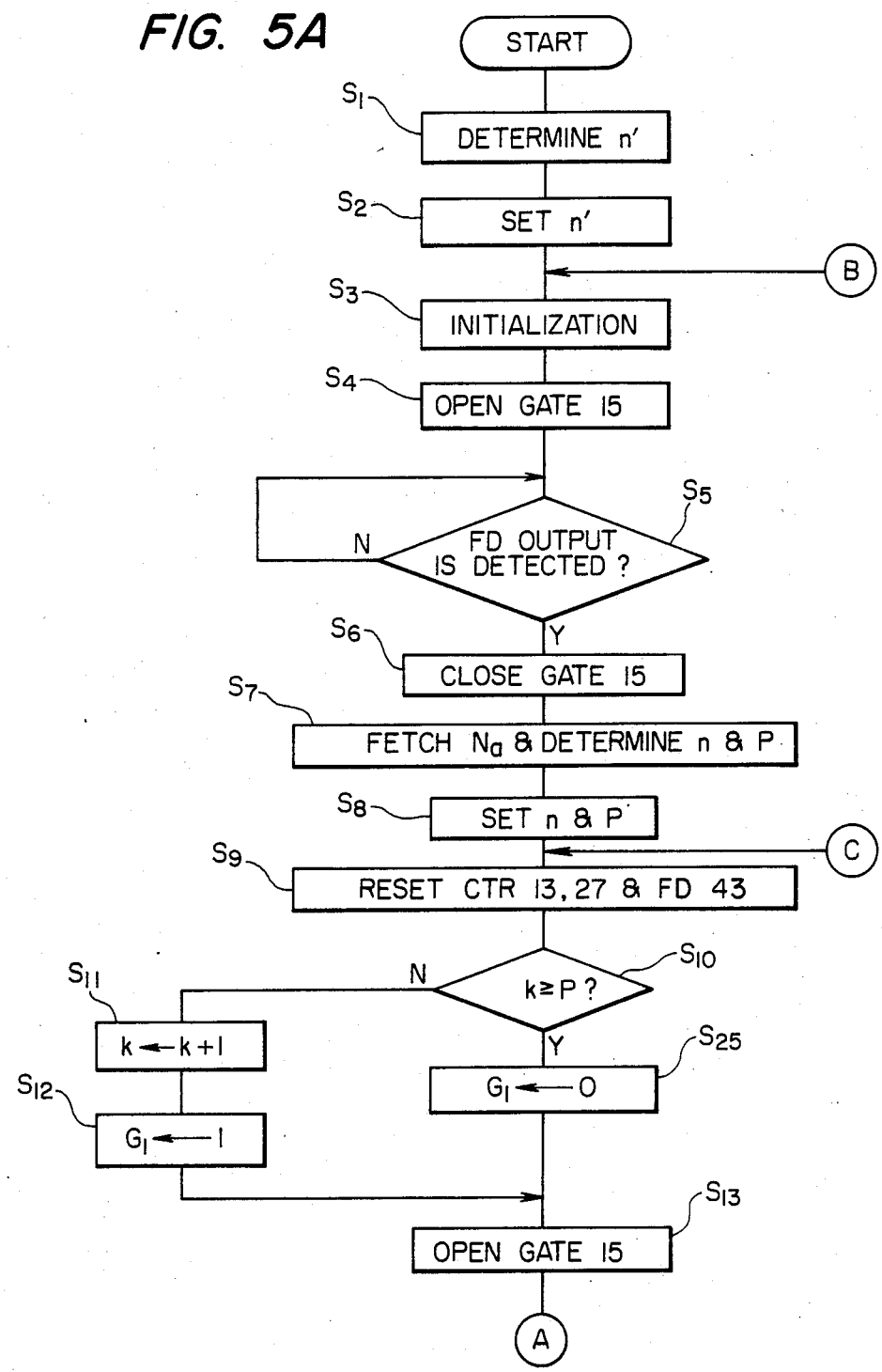

DEVICE FOR MEASURING AVERAGE FREQUENCIES

BACKGROUND OF THE INVENTION

The present invention relates to an average-frequency measuring device for indicating an accurate frequency by measuring the frequency of an input signal for a plurality of times and then averaging the measured frequencies.

For measuring a carrier frequency of a so-called burst signal such for example as radar pulses in which a carrier signal is 100% amplitude-modulated by pulses, cycles of the carrier wave are counted over a plurality of burst signals to increase the measurement accuracy. If a measurement period if fixed, however, the accuracy of measurement of frequencies varies dependent on the length of the burst signal and the repetition frequency.

To cope with the above problem, there has been proposed a frequency measuring device for indicating measured frequencies having a desired predetermined measurement accuracy in measuring a frequency of a certain portion of a repetitively swept frequency signal, and other carrier frequencies of repetitive signals, as disclosed in U.S. Pat. No. 4,468,614. According to the proposed device, when a measurement process is started, the length $\tau$ of a count period in one burst signal in an input signal is calculated, a required net counting period is calculated from the length $\tau$ and a measurement accuracy setting R, and the input signal and a clock signal is counted until the sum of count periods in respective burst signals reaches the net counting period. Any measured frequency value is not displayed unless the counting of the net counting period is completed. In case the width of the burst signals is small and the repetition frequency is low as with radar pulses, it takes a considerable length of time before a measured result becomes available after the measurement has started. Since the above cycle is successively repeated for measurement, the measured results are renewed only upon elapse of each net counting period, even when the input signal is continuously measured. In the proposed device above, the block signal is counted by a counter circuit, and the count is used to detect when the net counting period reaches its calculated value, that is, when the counting is finished. Where such a process is monitored at all times by a microcomputer, the microcomputer is subjected to a large burden. The detection of such a count ending time is therefore implemented by hardware. However, the hardware arrangement is complicated since the counter circuit has many bit positions.

In view of the foregoing, it may be possible a divide-by-$10^n$ frequency divider could be employed, i.e. a $1/10^n$-frequency divider, as the counter circuit, to determine the frequency-division ratio n so that the period, from when the frequency divider starts the frequency division until an output is produced from the frequency divider, is longer than the calculated net counting period, and the microcomputer is then interrupted when the frequency divider output is issued, so as to measure the frequency of an input signal from the count value of the input signal at the time. Such an arrangement would be quite simple in construction since the microcomputer would not be required to monitor the clock signal count in the counter at all times and also since there would be no need for hardware for detecting a count ending time because the end of the counting is detected when the frequency divider output is issued. However, the net counting period would be such as 0.01 second, 0.1 second, 1 second, 10 seconds, or 100 seconds, for example. If the calculated net counting period were 12 seconds, for example, the period required for frequency division up to when a frequency divider output is produced after the frequency divider has started its operation would be required to be 100 seconds. After the counting period of 12 seconds necessary for producing a measured value having a respective measurement accuracy setting has elapsed, another counting period of 88 seconds would be needed. Since the counting period would be a net period, and a long period free from any counting operation would be present between adjacent burst signals, a long and wasteful period of time would be consumed before a measured value would be displayed.

SUMMARY OF THE INVENTION

It is an object of the present invention to provide an average-frequency measuring device having a relatively simple arrangement capable of producing a measured value of a predetermined measurement accuracy within a relatively short period of time.

Another object of the present invention is to provide an average-frequency measuring device capable of producing an approximate measured value before a measured value of a predetermined measurement accuracy is generated.

In a device of the present invention, a preliminary gate signal which determines one counting period is repeatedly generated by a preliminary signal generator and converted by a gate signal generator into a synchronizing gate signal in synchronism with a clock signal or an input signal. A first gate is opened by the synchronizing gate signal, and the input signal is counted by a first counter circuit while the first gate is open. A second gate is opened by the synchronizing gate signal, and while the second gate is open the clock signal is supplied to a divide-by-$10^n$ frequency divider which divides the frequency by $10^n$. The number k of outputs from the frequency divider is counted by a second counter circuit. The number of synchronizing gate signals is counted by a third counter circuit. A control means is controlled by a control signal to cause the gate signal generator to generate the synchronizing gate signal. The generating of the synchronizing gate signal is stopped in response to the output from the frequency divider supplied to the control means. For the operation of the measuring device, a suitable value n' of n is determined by a frequency-division-ratio determining means as explained below, and the value n' is set to the frequency divider for $10^{n'}$-division. Then, the control signal is applied to the control means for the frequency-division-ratio determining means, thereby starting the gate signal generator to generate the synchronizing gate signal. Upon reception of the first output from the frequency divider, the control means stops the gate signal generator and $Na/(R \times Tc)$ indicating the number of clock pulses expected to be counted within a net counting period Tg in the following measuring process is calculated by the frequency-division-ratio determining means based on a count Na of the third counter circuit at the time the first output is produced from the frequency divider, the predetermined measurement accuracy setting R, and a period Tc of the clock signal. Values of P and n are determined so that $P \times 10^n$ is greater than but close to the calculated value Na/(R×Tc) for the value of P being an integer equal to or greater than 2. For example, if Na/R(R×Tc) is 1 through 999, then P can be 2 through 10, or if Na/(R×Tc) is 1000 through 2000 then P can be 10 through 20. The n is applied through a setting unit to establish a frequency-division ratio $10^n$ of the frequency divider for the succeeding repetitive measurements. Then, the control signal is applied to the control means by a repetition means, and when the output is produced from the frequency divider, a count F is picked up from the first counter circuit. Thereafter, the first counter circuit is reset and the control signal is applied to the control means. The above process is repeated P times. That is, each count F picked up at the respective time is stored in a buffer memory. Each time the count F is picked up from the first counter circuit, a calculating means calculates the average value f of a current count F and the k−1 preceding counts for F that are stored in the buffer memory, and from the count k from the second counter means, and determines an average frequency $f/(10^n \times Tc)$ of the input signal from the average value f. A transition detecting means detects a condition in which the count k of the second counter means is equal to or below (P−1). The value $10^n \times Tc$ is generally selected to be a unit time so that the value of the average frequency $f/(10^n \times Tc)$ can be directly read as the average count value f, in other words so that it would suffice to display the count value f on a display unit, rather than to calculate the average frequency $f/(10^n \times Tc)$ and display the calculated frequency. Thus the count value f is displayed each time the output from the frequency divider is obtained. If k≦P−1, a mark representing such a condition is displayed on the display unit, so as to indicate that the value of the average frequency (i.e. equivalent to the average count value (f) presently on the display has an accuracy lower than the measurement accuracy setting R. The suitable value n' of n referred to above is determined to be the smallest integer satisfying $1/(R \times Tc) < 10^{n'}$ for the preset measurement accuracy R and the clock signal period Tc, and the determined value n' is set in the frequency divider through a setting unit. Thereafter, operation is effected to obtain the count Na in the frequency-division-ratio determining means. When the count k of the second counter means reaches P, k is fixedly equalized to P in the calculating means. The buffer memory erases the oldest count F and holds at least the latest P counts of F each time the count F is obtained from the first counter circuit. When a variation in the average frequency determined by the calculating means is below a predetermined value, such a condition is detected and displayed on the display unit, thus indicating that the average frequency now being displayed does not have but is close to the preset measurement accuracy. The repetition means picks up a count N from a third counter circuit and subsequently resets the third counter circuit each time the output from the frequency divider is obtained. Each count N obtained at this time and a value corresponding to the previously-obtained count Na from the third counter circuit that is stored in the frequency-division-ratio determining means are compared. When they are substantially equal to each other, the count F at the time is stored in the buffer memory and an average frequency is calculated. When N is widely different from Na, no count F at the time is stored in the buffer memory, and no average frequency is calculated, but the frequency-division-ratio determining means is operated again to set n and P again.

The above and other objects, features and advantages of the present invention will become more apparent from the following description when taken in conjunction with the accompanying drawings in which preferred embodiments of the present invention are shown by way of illustrative example.

BRIEF DESCRIPTION OF THE DRAWINGS

FIGS. 5A and 5B illustrate a flowchart showing operation of the device of FIG. 3 and the processor of FIG. 4;

DESCRIPTION OF THE PREFERRED EMBODIMENTS

Figure 1:
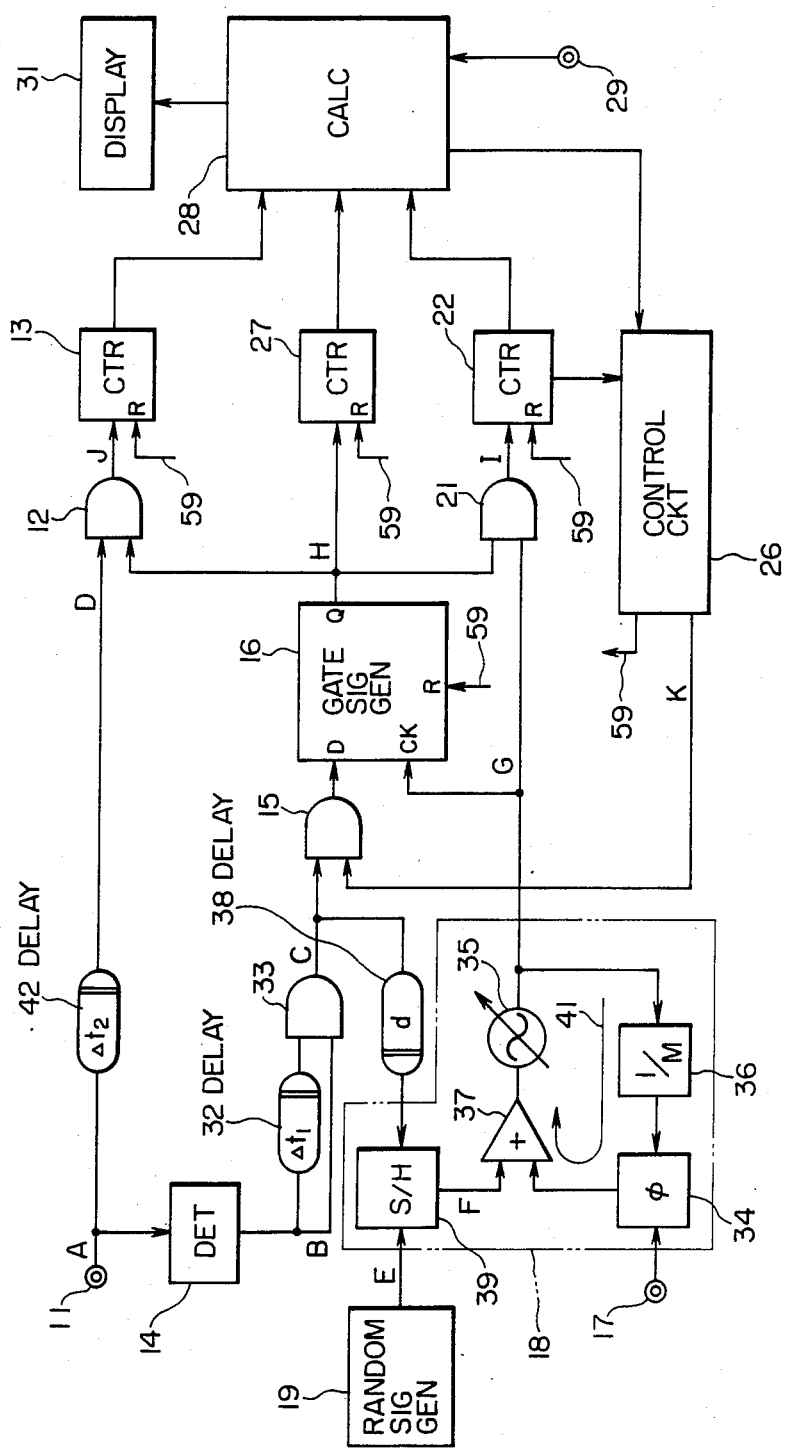
FIG. 1 is a block diagram of a conventional device for measuring average frequencies.

Prior to describing the embodiments of the present invention, an average-frequency measuring device as disclosed in U.S. Pat. No. 4,468,614 will be described with reference to FIG. 1. An input signal from an input terminal 11 is supplied through a delay circuit 42 to a gate 12. An output from the gate 12 is counted by a counter 13. Where the input signal is a so-called burst signal, that is, a pulse-modulated wave such as a radar wave as shown in FIG. 2A, and the carrier frequency of such an input signal is to be measured, the frequency is measured only in a period of the pulse-modulated wave, and hence a preliminary gate signal is produced for measuring the counting period. For example, the input signal from the input terminal 11 is branched off and supplied to a detector 14 from which a detected output is applied directly and through a delay circuit 32 to an AND gate 33. The detector 14 produces a detected output as shown in FIG. 2B, and the detected output is delayed by $\Delta t_1$ by the delay circuit 32. The AND gate 33 therefore produces an output having a rising edge which is delayed by $\Delta t_1$ from a rising edge of the output of the detector 14 and a falling edge which is aligned with a falling edge of the output of the detector 14. The output of the AND gate 33 serves as the preliminary gate signal which is applied to a gate 15.

A clock signal is supplied from a terminal 17 to a phase comparator 34 in which the clock signal is compared with an output from a frequency divider 36 that frequency-divides an output from a voltage-controlled oscillator (VCO) 35 by M. The phase comparator 34 issues an output to an analog adder 37. The output from the AND gate 33 is supplied through a timing delay circuit 38 to a sample and hold circuit 39 which samples and holds a random-level signal, as shown in FIG. 2E, from a random signal generator 19 at a timing slightly delayed from the falling edge of the preliminary gate signal from the AND gate 33. The level of the sampled and held signal is varied at random as each preliminary gate signal is applied, as shown in FIG. 2F, and the sampled and held signal is fed to the adder 37. Stated otherwise, the VCO 35, the frequency divider 36, the phase comparator 34, the adder 37 jointly constitute a so-called phase-locked loop (PLL) 41. Thus, the output from the VCO 35 is stablized with the stability of the clock signal from the terminal 17, and a clock signal having a frequency that is M times the frequency of the clock signal from the terminal 17 is produced from the VCO 35. The oscillation phase of the VCO 35 is varied by the random signal applied to the adder 37 as shown in FIG. 2F each time the preliminary gate signal is applied. The phase is held until it is changed for the next preliminary gate signal. The output from the VCO 35 is applied as a clock signal to a clock terminal CK of a D-type flip-flop 16 serving as a gate signal generator and also to a gate 21. The PLL 41 and the sample and hold circuit 39 jointly constitute a phase modulation circuit 18.

The gate signal generator 16 issues as an output a synchronizing gate signal (FIG. 2H) positioned centrally of a pulse-modulated wave shown in FIG. 2D which is delayed by $\Delta t_2$ by the delay circuit 42. The delay $\Delta t_2$ caused by the delay circuit 42 is selected so that the gate signal will always fall within a period of each burst wave from the delay circuit 42 regardless of the phase variation occasioned by the random signal generator 19. The gates 12, 21 are controlled by the synchronizing gate signal to issue outputs (FIGS. 2J and 2I) which are counted by counters 13, 22.

More specifically, the gate signal generator 16 generates a synchronizing gate signal which is in synchronism with the clock signal and has a duration which is an integral multiple of the period of the clock signal. The synchronizing gate signal controls the gates 12, 21, as described above. The synchronizing gate signal is counted by a counter 27. When the count in the counter 27 reaches a suitable value Na, a pulse duration $\tau = Ta/Na$ in units of the clock period Tc of the synchronizing gate signal is calculated by a calculating unit 28 from the value Na and a count Ta in the counter 22. Furthermore, $(1/\tau)(1/R)^2$ is calculated from the pulse duration $\tau$ and a measurement accuracy R set through a terminal 29, and a net counting period Tg is determined so as to be greater than the calculated value $(1/\tau)(1/R)^2$. The determined net counting period Tg is given to a control circuit 26 which will close the gate 15 when a net counting period in the counters 13, 22 exceeds Tg. Thereafter, the calculating unit 28 calculates F/T from counts F, T from the counters 13, 22, and the calculated value is displayed as a measured frequency on a display unit 31.

Accordingly, frequencies can be measured at a preset measurement accuracy even when burst signals applied have different lengths and periods. However, it is a heavy burden on the calculating unit 28 to pick up a count frequently from the counter 22 and to determine whether the count has reached a value corresponding to the determined period Tg. Moreover, a circuit in the control circuit 26 for comparing the count from the counter 22 and the determined period Tg from the calculating unit 28 is relatively complex. If the counter 22 comprises a $1/10^n$-frequency divider, and if the net counting period Tg is deemed as ended when an output is issued from such frequency divider 22, the calculating unit 28 is subjected to a lesser burden, or the control circuit 26 is much simpler in arrangement.

With the counter 22 comprising a $1/10^n$-frequency divider, however, the determined net counting period Tg would be 0.01 second, 0.1 second, 1 second, 10 seconds, or 100 seconds, for example, for determining n in order to meet the preset measurement accuracy R. Even if frequencies could be measured with the preset measurement accuracy in an actual net counting period Tg of 12 seconds, for example, a determined Tg would have to be 100 seconds. Therefore, the determined net counting period would be longer by 88 seconds. Furthermore, since the burst signal includes periods that are not counted, the time when any measured value is available would be greatly delayed because of the additional net counting period.

Figure 3:
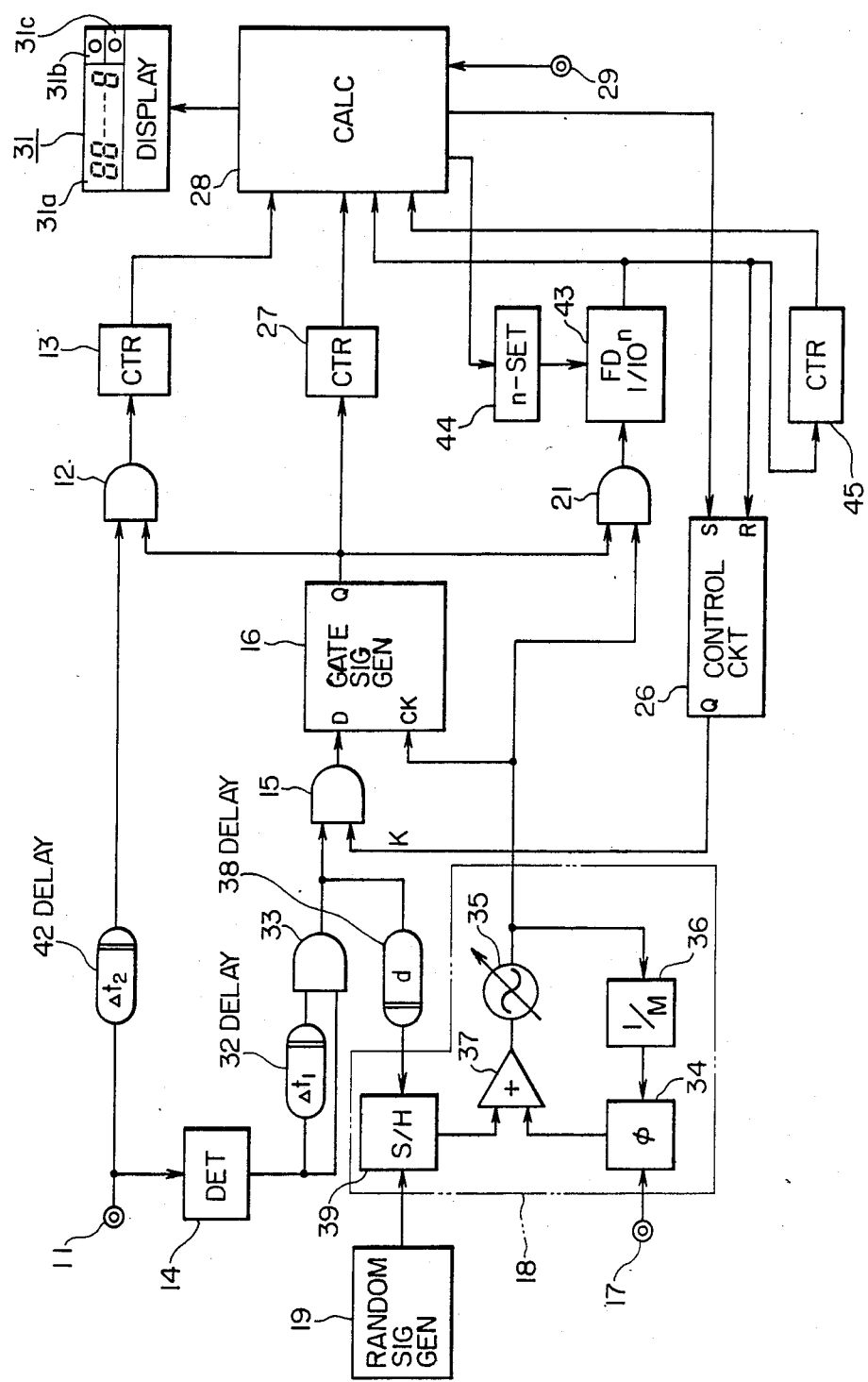
FIG. 3 is a block diagram of a device for measuring average frequencies according to the present invention.

FIG. 3 illustrates an average-frequency measuring device according to an embodiment of the present invention. Identical or corresponding parts in FIG. 3 are denoted by identical or corresponding reference characters in FIG. 1. According to the present invention, a $1/10^n$-frequency divider 43 is employed in place of the counter 22. The frequency divider 43 frequency-divides an input clock signal by $10^n$ with n (n is a positive integer) set by a setting unit 44. Thus, the frequency divider 43 issues an output when it counts $10^n$ input clock pulses. The frequency divider 43 comprises, for example, a plurality of cascaded modulo-10 counters and issues as a frequency-divided output a carry output from the nth modulo-10 counter dependent on n set by the setting unit 44. The frequency divider 43 may comprise a frequency divider which is commercially available as an IC. The calculating unit 28 can set n in the setting unit 44. The value of n is selected such that each net counting period (i.e. $10^n \times$ clock period) corresponding to a count $10^n$ may be shorter than the net counting period Tg corresponding to a desired measurement accuracy R in the case of FIG. 1. The counting operation of the counter 13 is repeated until the output of the frequency divider 43 is produced plural times.

An output from the frequency divider 43 is applied to a reset terminal of an RS flip-flop which serves as the control circuit 26, and also to a counter 45. The count from the counter 45 is read by the calculating unit 28, which can set the flip-flop 26.

Figure 4:
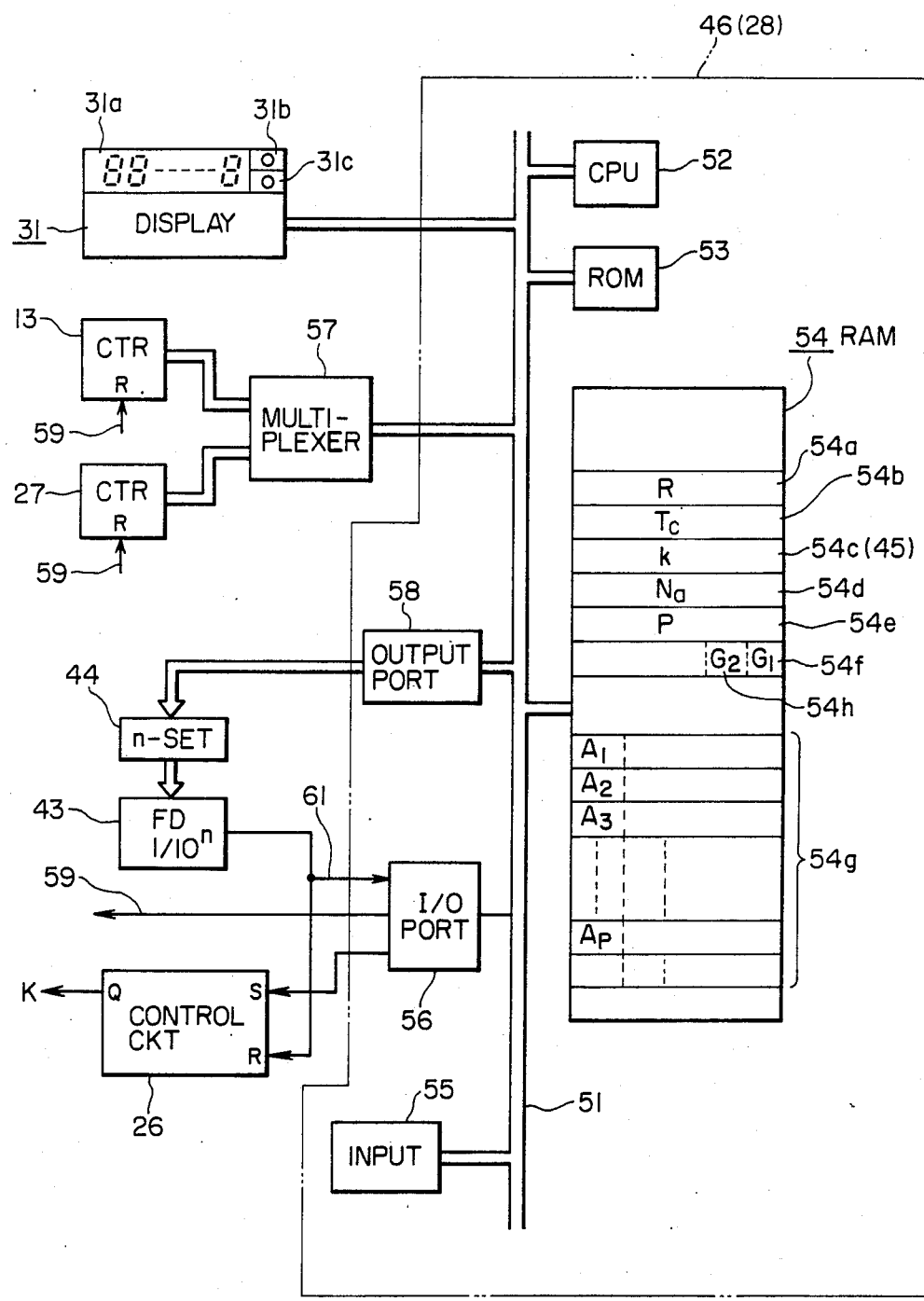
FIG. 4 is a block diagram of a calculating unit comprising a microcomputer.

The calculating unit 28 may comprise a microcomputer, with the counter 45 being functionally incorporated in the microcomputer. For example, as shown in FIG. 4, a microcomputer 46 includes a central processing unit (CPU) 52, a read-only memory 53, a random-access memory 54, an input unit 55 such as a keyboard, and an input/output port 56, all connected to an internal bus 51. There is an internal port (not shown) interposed between the input unit 55 and the internal bus 51. The display unit 31 is connected to the bus 51 through an output port (not shown). The counters 13, 27 are connected to the multiplexer 57 which is controlled to deliver counts from the counters 13, 27 into the microcomputer 46. The microcomputer 46 issues a control signal (FIG. 2K) for opening the gate 15 (FIG. 3) through the input/output port 56 to the flip-flop 26, issues a reset signal to a lead wire 59 through the input/output port 56, and detects an output from the frequency divider 43 through the I/O port 56 connected to the frequency divider 43 by a lead wire 61. By delivering the reset signal from the lead wire 59, the microcomputer 46 resets the counters 13, 27, the flip-flops 16, 26, and the frequency divider 43. A number n from the microcomputer 46 can be set in the setting unit 44 through an output port 58. A desired measurement accuracy R is set through the input unit 55 and is read into an area 54a in the random-access memory 54.

The CPU 52 successively reads a program stored in the read-only memory 53 and executes the program for performing predetermined processing steps. Operation of the arrangements shown in FIGS. 3 and 4 will now be described with reference to the flowchart of FIGS. 5A and 5B. A value n' of n to be set in the setting unit 44 is temporarily determined in a step $S_1$ from a preset measurement accuracy R and a period Tc of a clock signal from the terminal 17 (FIG. 3). As described above, the unit of the measurement accuracy R is Hz, and the smaller the R the higher the measurement accuracy. The unit of the period Tc is seconds, and the period Tc is stored in advance in the area 54b of the random-access memory 54 through the input unit 55. In the case of the input signal being a continuous wave, in order to obtain a measured frequency with the accuracy R, it is necessary to wait for a counting period Tg' given by $Tg'=1/R$, which is determined by counting $Tg'/Tc=1/(R\times Tc)$ clocks. The clocks are counted by the $10^n$-frequency divider 43 and, when a carry output is produced therefrom, it is decided that $10^{n'}$ clocks have been counted. Therefore, in order to ensure the accuracy R, the value n' of n for $10^n$-frequency division should be selected to satisfy $1/(R\times Tc)>10^{n'}$. The count value for producing the desired accuracy can be expressed as $1/(R\times Tc)=Q\cdot 10^1$ thus defining the value of a positive integer q and the value of a positive number Q satisfying $1<Q\leq 10$. The value n' of n should be selected to be the smallest integer satisfying $Q\cdot 10^q\cdot 10^{n'}$, when is $n'=q+1$. Therefore, instead of counting the clocks for the period $Tg=Q\cdot 10^q\cdot Tc$, the $10^n$-frequency divider is set to count $10^{n'}=10^{q+1}$ clocks. That is, the counting period Tg' in the preliminary process is set to be $Tc\cdot 10^{n'}$ and it holds that $Tg'\geq 1/R$. This n' is set in the setting unit 43 in a step $S_2$ to put the frequency divider 43 in readiness for frequency division by $10^{n'}$. Then, the counters 13, 27, the frequency divider 43, the flip-flops 16, 26, the counter 45 utilizing an area 54b in the random-access memory 54, and other necessary circuits are initialized in a step $S_3$.

The flip-flop 26 is set through the input/output port 56 to cause its Q output to go high in level, thus opening the gate 15 to start the counting operation in step $S_4$. More specifically, as described above with reference to FIG. 1, the flip-flop 16 produces a synchronizing gate signal in synchronism with the input burst signal and the clock signal to open the gates 12, 21, whereupon the input signal having passed through the gate 12 is counted by the counter 13 and the clock signal having passed through the gate 21 is frequency-divided by the frequency divider 43. A step $S_5$ waits for the generation of an output from the frequency divider 43. When $10^{n'}$ clock signal pulses are applied to the frequency divider 43, the frequency divider 43 produces its output which is supplied through the input/output port 56 to interrupt the microcomputer 46 in a step $S_6$. The output from the frequency divider 43 also resets the flip-flop 26 to make its Q output low in level, thus closing the gate 15 to stop the counting operation. The microcomputer 46 is responsive to the interrupt command for reading a count Na from the counter 27, storing the count Na in an area 54d in the random-access memory 54, and determining n, P in step $S_7$ as explained below. Let the number of synchronizing gate signals in the net counting period Tg during which the counter 13 performs counting be indicated by N. The measurement accuracy R is given by $R=(1/\tau)\times(1/\sqrt{N})$, and since $N=Tg/\tau$, Tg is expressed by $Tg(1/\tau)\times(1/R^2)$. Denoting the number of synchronizing gate signals counted during the net counting period Tg' for $10^{n'}$ clocks by Na, the pulse duration $\tau$ of the synchronizing gate signal can be approximately expressed by $\tau=Tg'/Na$ and the net counting period Tg can be expressed by $Tg1/(\tau R^2)=Na/(Tg'R^2)$. Since the counting period Tg' for the $10^{n'}$ clocks is selected such that $Tg'\leq 1/R$, it holds that $Tg\leq Na/R$. Therefore, in order to obtain a desired measurement accuracy, it is necessary to count approximately $Tg/Tc=(Na/R)\times(1/Tc)$ clocks. The count value can be expressed as $Tg/Tc=P'\times 10^n$ where P' is selected to satisfy $1<P'\leq 10$ or $10\leq P'<100$ by selecting an appropriate value for the integer n. The number P is determined by rounding upward the value of P', that is, P is the smallest integer that satisfies $P'\leq P$. Accordingly, it holds that $10^n\leq Tg/Tc\leq P\times 10^n$. By definition one can set $P\cdot 10^n=P\cdot T_{gk}/Tc$, where $T_{gk}$ represents a net period for counting $10^n$ clocks by the frequency divider 43. Thus, by setting the value n to the $10^n$ of the frequency divider 43 and averaging at most P successive values of the measured frequencies each obtained when a carry is produced from the frequency divider 43 as explained below, it is possible to obtain an average measured frequency of the input burst signal with the accuracy R. The step $S_7$ is effected by a means for determining a frequency-division ratio in the microcomputer.

A step $S_8$ sets n into the setting unit 44, and P into an area 54e in the memory 54. A step $S_9$ resets the counts F, N in the counters 13, 27 and the frequency divider 43 to zero. A step $S_{10}$ checks whether a count k in the counter 45 in the memory 54 has reached P in the memory area 54e. If the count k has not reached P, k is incremented by +1 in a step $S_{11}$, and a flag $G_1$ indicating that a measured value does not reach the measurement accuracy R is set to "1" in a step $S_{12}$, the flag $G_1$ being stored in an area 54f in the memory 54. A control signal is issued in a step $S_{13}$ to set the flip-flop 26 for thereby opening the gate 15 to start the counting operation. A step $S_{14}$ waits for an output from the frequency divider 43. When the output from the frequency divider 43 is produced, the gate 15 is closed and the microcomputer is interrupted by the output from the frequency divider 43 in a step $S_{15}$. In a step $S_{16}$, a count $N_k$ from the third counter 27 is read and compared with the $Na\cdot 10^{n-n'}$ which has been read and stored in the memory area 54d in the step $S_7$. If the difference between $N_k$ and $Na\cdot 10^{n-n'}$ falls within about $\pm 20\%$ of $Na\cdot 10^{n-n'}$, for example, then data items in buffers $A_1$ through $A_{p-1}$ of a data buffer area 54g in the memory 54 are successively transferred to the buffers $A_2$ through $A_p$, and the data in the buffer $A_p$ is discarded in a step $S_{17}$. Thereafter, the count F of the counter 13 is read and stored as data in the buffer $A_1$.

Then, a step $S_{18}$ is executed by the calculating unit in the microcomputer 46 to read and add data $F_1$ through $F_p$ in the buffers $A_1$ through $A_p$ and divide the sum by the count k of the counter 45 to produce an average value f. Since the frequency divider 43 effects frequency division by $10^n$ at this time, as described above, the time required for the frequency divider 43 to produce its output after it has started its operation corresponds to a unit time by selecting the clock signal period Tc to be $1\times 10^{-4}$ (r is an integer of 1 or greater), and the average value f is indicative of an average frequency $f/(10^n\times Tc)$ of the input signal carrier. A step $S_{19}$ checks if the count k is smaller than P. If it is smaller than P, then a step $S_{20}$ successively determines the differences between adjacent ones of the data items $F_1$ through $F_p$. Then, in a step $S_{20}$ an average $\Delta f$ of the differences $\Delta F_1$ through $\Delta F_{p-1}$ is calculated. In a step $S_{21}$ the average $\Delta f$ is divided by the average frequency f and it is checked whether the quotient is smaller than a prescribed value a, for example 0.01. If the quotient is greater than the value a, then the measured data items, $F_1$, $F_2$ . . . are found to differ widely from each other. The average frequency f is now likely to be widely different from the desired frequency to be measured. In this case, a flag $G_2$ in a memory area $54h$ is set to "0" in a step $S_{22}$.

Then, the average frequency f and the flags $G_1$, $G_2$ are supplied to the display unit 31 in a step $S_{23}$. The display unit 31 displays the average frequency f on a data display section $31a$. If the flag $G_1$ is "1", a display section $31b$ emits red-colored light, for example, to indicate that the value displayed on the data display section $31a$ is of an accuracy lower than the preset measurement accuracy. A display section $31c$ in the display unit 31 is indicative of the flag $G_2$ and is not energized when the flag $G_2$ is "0".

Figure 6:
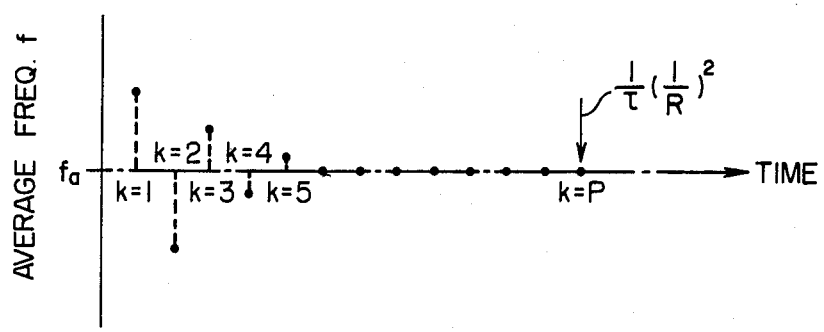
FIG. 6 is a diagram showing how measured values converge.

The program then returns to the step $S_9$. Thereafter, counting operation is effected after the frequency divider 43 has started its frequency division until it produces an output. A count F is read from the counter 13 to determine an average frequency f. The above operation is repeated by repetition means in the microcomputer 46. The number of data items in the data buffer area $54g$ is therefore increased in this manner. The obtained avarage frequency f now converges toward a certain value fa as the number k of measurement cycles is increased as shown in FIG. 6. If the step $S_{21}$ determines that $\Delta f/f$ is below the prescribed value, then the program goes to a step $S_{24}$ to set the flag $G_2$ to "1". In response to the flag $G_2$ set to "1", the display section $31c$ of the display unit 31 emits blue-colored light, for example, indicating that the average frequency displayed at the time has an accuracy considerably close to the preset measurement accuracy if the display section $31b$ also emits red-colored light at this time. The flag $G_2$ is set to "1" when k becomes close to P/2 in general.

When the number k of measurement cycles has reached the preset value P, it is detected in the step $S_{10}$, and the program goes to a step $S_{25}$ to set the flag $G_1$ to "0". Under this condition, all of the buffers $A_1$ through $A_p$ have been filled with data items in the steps $S_{17}$. Thus, the step $S_{19}$ determines that k is equal to or greater than P, and the program goes to the step $S_{23}$. However, the step $S_{19}$ may be omitted and the program may proceed from the step $S_{18}$ directly to the step $S_{20}$. If the flag $G_1$ is "0", the display section $31b$ is de-energized, and the blue-colored light emitted from the display section $31c$ indicates that the data being displayed has the preset measurement accuracy.

If the measurement is to be continued after the number k of measurement cycles has reached P, then old data items are successively discarded in the step $S_{17}$ so that the latest P data items will remain in the data buffer area $54g$. Since the latest P data items are present in the data buffer area $54g$ at all times, a new average frequency f having the preset measurement accuracy R is obtained at each time interval of $10^n \times Tc$ after k has been P. If the count $N_k$ is widely different from $10^{n-n'}Na$ in the step $S_{16}$, then it is determined that n, P have been determined erroneously in the step $S_7$, or that the input signal or the measurement process have been subjected to errors, or that other malfunctioning has taken place, and the program goes back to the step $S_3$ for another measurement process. The steps $S_{19}$, $S_{20}$, $S_{21}$, $S_{24}$ may be omitted. With such a modification, how the data displayed on the display section $31a$ varies may be observed under the condition in which no preset measurement accuracy is obtained, that is, the energized condition of the display section $31b$, to thereby determine that the data has been considerably close to the desired data.

Figure 5B:
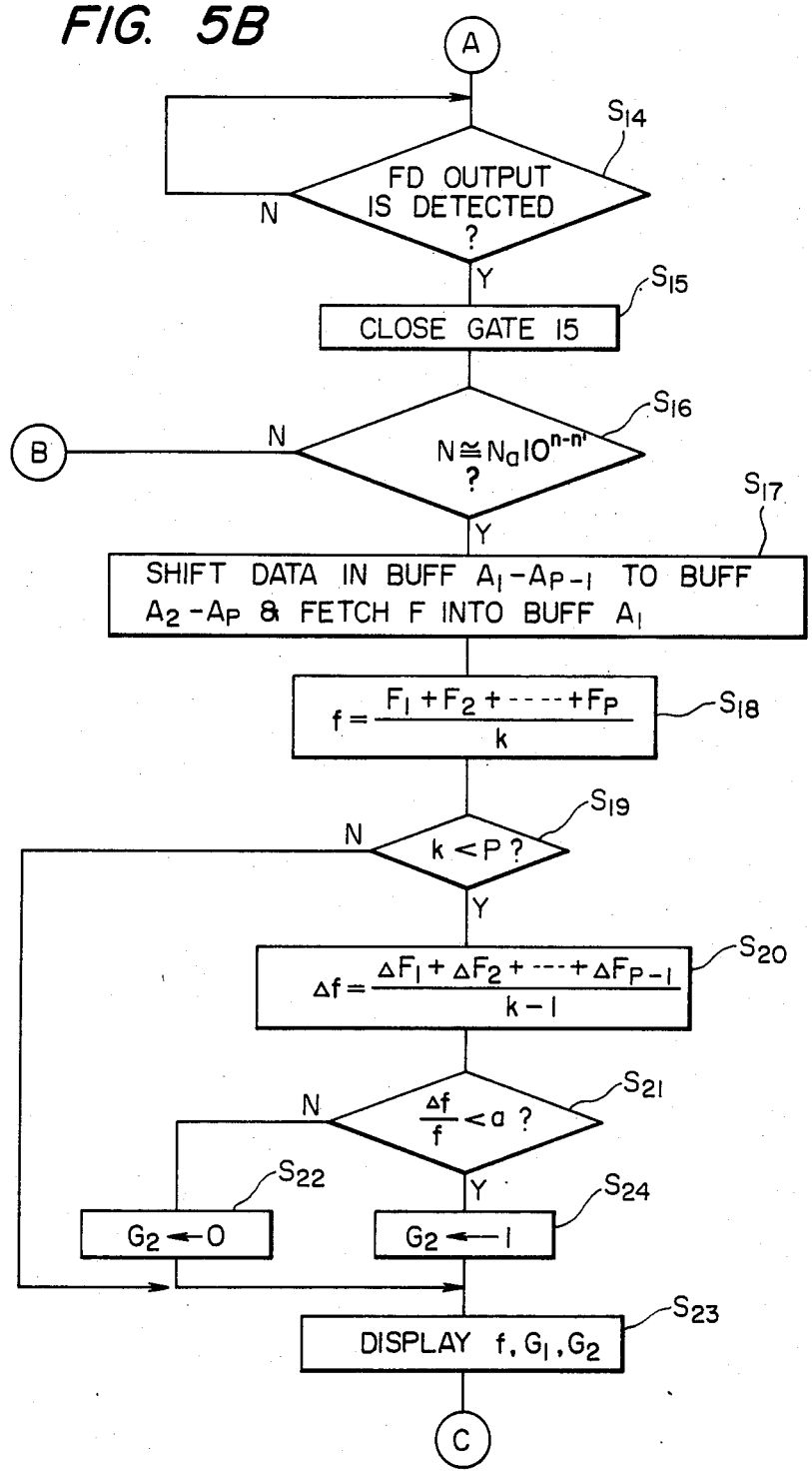

From the foregoing description, it can readily be understood that where the counter 45 is provided outside of the calculating unit 28 as shown in FIG. 3, the count k of the counter 45 should be read and processed in the same manner as described with reference to FIGS. 5A and 5B each time an output is produced by the frequency divider 43. In any case, the step $S_1$ may be omitted from the flowchart of FIGS. 5A and 5B if the measurement accuracy is of a predetermined fixed value.

A measurement example will be described in which a radar signal with a pulse duration of 120 nsec., a pulse duration $\tau$ of the synchronizing gate signal being about $(120-50)$ nsec. $= 70$ nsec., the repetition frequency $f_p$ being 3200 Hz, and the carrier frequency being 9.41 GHz, which is frequency-converted into 210 MHz and measured using a clock signal having a frequency of 100 MHz ($Tc = 10$ nsec. $= 1 \times 10^{-8}$ sec.) and the desired measurement accuracy (resolution) R being 10 kHz.

According to the device of the present invention, n' is determined to be 4 from $1/(R \times Tc) \times 1/(10^4 \times 10^{-8}) = 10^4$ in the step $S_1$. In the step $S_7$, $Tg/Tc = (Na/R) \times (1/Tc) = 1.43 \times 10^7$ is calculated using $Na \approx 1430$ counted by the counter 27, $R = 10^4$, and $Tc = 10^{-8}$, and $P = 15$, $n = 6$ thusly determined. Therefore, the period $T_{gk}$, from when the frequency divider 44 has started its operation until it produces an output, is $10^n \times Tc \times (1/f_p) \times (1/\tau) = 44.6$ sec. The display section $31a$ thusly displays new data at each time interval of about 45 sec., and upon lapse of $T_m = P \times T_{gk} = 15 \times 45$ sec. $= 675$ sec. $= 11$ minutes, approximately a measured average frequency f having the preset measurement accuracy R is displayed on the display section $31a$. Thereafter, the average frequency f having the preset measurement accuracy R is displayed on the display section $31a$ at intervals of about 45 sec. As described above, the average frequency f considerably close to the preset measurement accuracy R is displayed on the display section $31a$ about P/2 after the measurement process has started. n, P are determined by obtaining Na thriough the counting in the steps $S_4$-$S_6$, and a measurement time $T_o$ therefor becomes equal to $10^{n'} \times Tc \times (1/\tau) \times (1/f_p) = 10^{n'} \times Tc \times R \times Na \times (1/f_p) \approx 446 \times 10^{-3}$ seconds using $\tau = (1/R) \times (1/Na)$. Therefore, an approximate average frequency f is displayed on the display section $31a$ about $T_o + T_{gk} = 46$ seconds after the measurement process has started.

Figure 2:
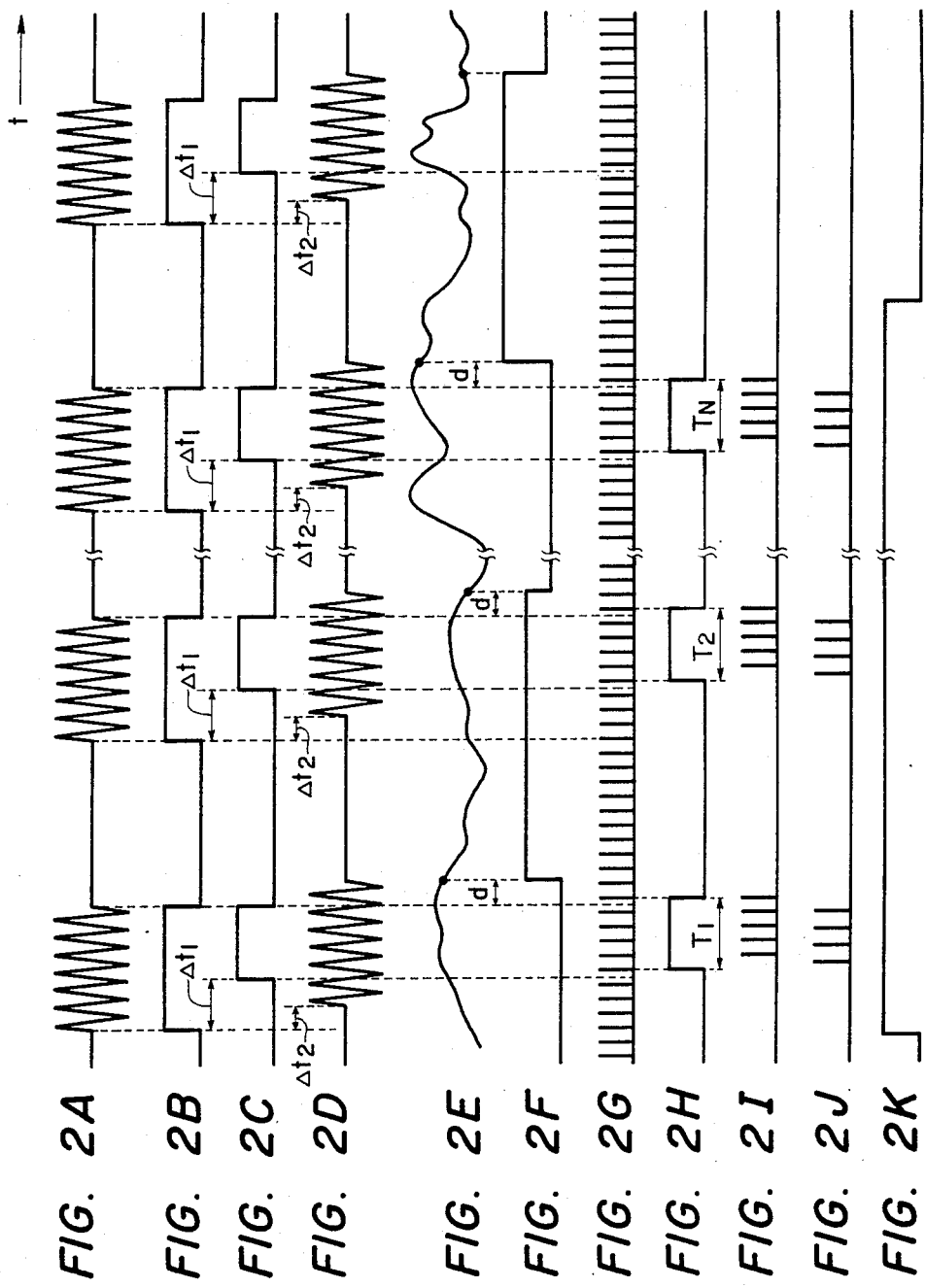
FIGS. 2A through 2K are timing charts illustrative of operation of the device shown in FIG. 1.

If the counter 22 were replaced with a $1/10^n$-frequency divider in the apparatus shown in FIG. 1, n would be determined as $n = 8$ from $Tg/Tc = (Na/R) \times (1/Tc) = 1.4 \times 10^7$. Therefore, a time $T_m'$ required after a measurement process has started until a measured value is obtained would be $10^n \times Tc \times (1/f_p) \times (1/\tau) = 4460$ sec. approximately. Therefore, a long time of about 84 min, would be required for measurement and nothing would be displayed during the time.

Where the device of FIG. 1 is used, $Ta/Na=\tau$ is found and $(1/\tau/Tc)(1/R)^2$ is calculated to determine a net measurement time $Tg_1$. Therefore the actual time that would be $T_m''$ required until a measured result is obtained becomes approximately $(1/\tau)(1/R)^2 \times (1/\tau) \times (1/f_p) = 638$ sec. $= 10.5$ min. approximately Thus the time for the device to take after the measurement process has started until a measured value is obtained is more than 10 minutes, and during that period of time no information on the average frequency is available. The measurement process is repeated from the first step each time one measured value is produced. The measured value is obtained only at intervals of about 10.5 min. in the case a frequency is to be continuously measured.

Figure 7:
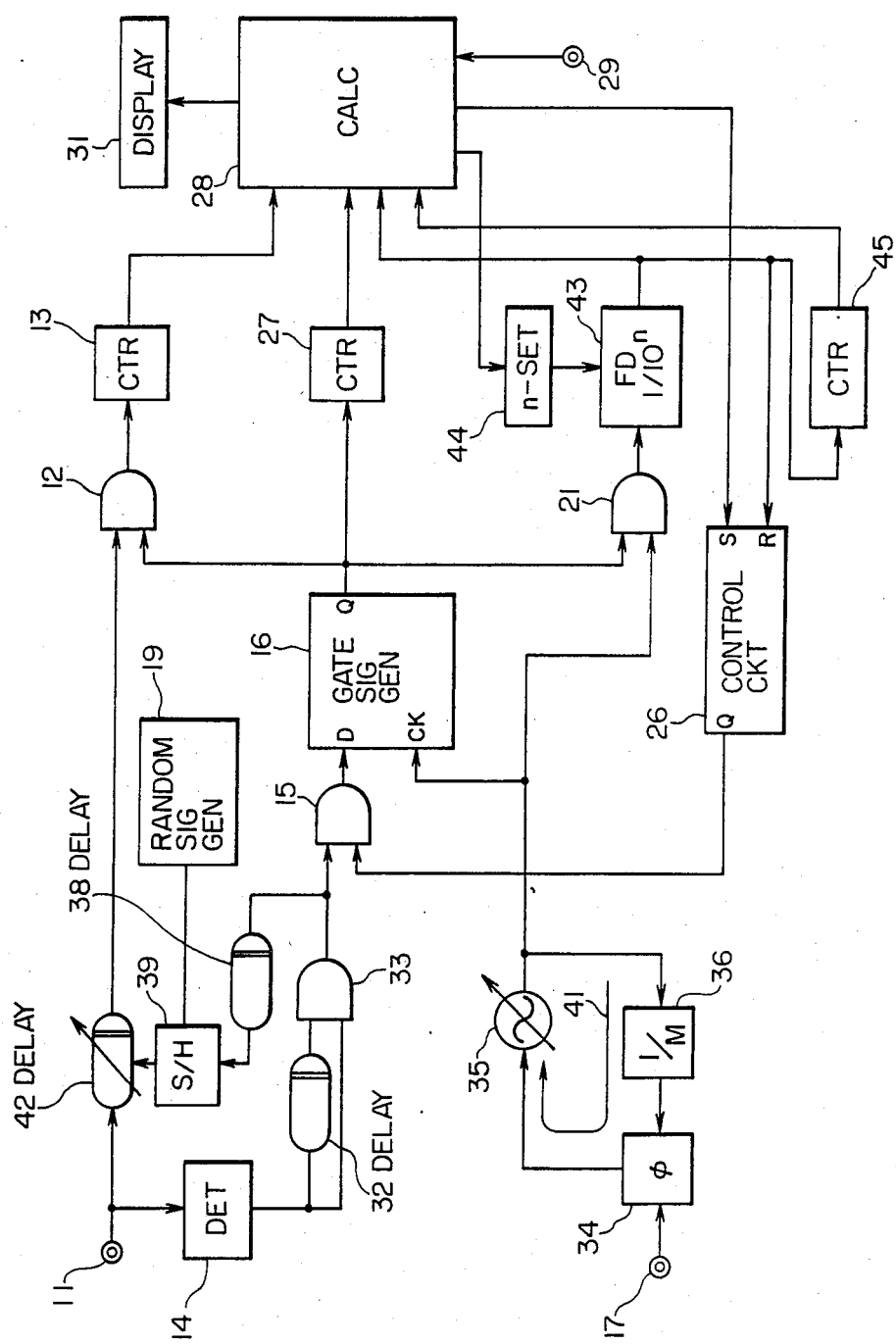
FIG. 7 is a block diagram of an average-frequency measuring device according to another embodiment in which the phase of an input signal is varied at random.

The phases of the input signal and the synchronizing signal are relatively varied at random each time the synchronizing signal is generated. To this end, the phase of the synchronizing gate signal is varied at random in the arrangement of FIG. 3. However, the phase of the input signal may instead be varied at random. More specifically, as shown in FIG. 7, the dealy circuit 42 comprises a variable delay circuit, and the delay produced by this delay circuit is controlled by an output from the sample and hold circuit 39, with the adder 37 in the PLL 41 in FIG. 3 being omitted. For some signals to be measured, a timing in synchronism with an input signal (burst signal) is generated. In such a case, the detector 14, the delay circuit 32, and the AND gate 33 may be omitted from the arrangement of FIG. 3, and a monostable multivibrator, for example, may be driven by the timing signal in synchronism with the burst signal to produce a preliminary gate signal which is supplied to the gate 15.

Figure 8:
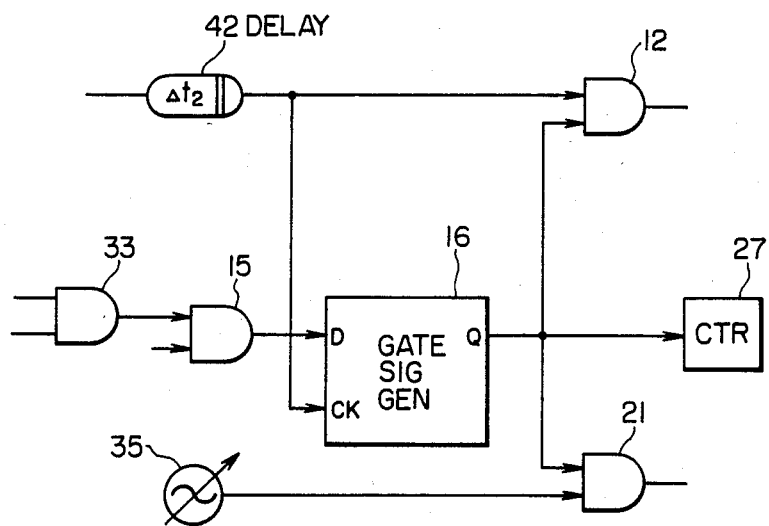
FIG. 8 is a block diagram of an arrangement in which a synchronizing gate signal is brought into synchronism with an input signal.

The present invention is applicable not only to measurement of the carrier frequency of a burst signal but also to measurement of the frequency of a portion of a repetition sweep frequency signal or the carrier frequencies of other repetition frequencies. The synchronizing gate signal may be generated in synchronism with the input signal, rather than the clock signal. For example, as shown in FIG. 8, a preliminary gate signal from the gate 15 is supplied to the gate terminal D of a flip-flop serving as the gate signal generator 16, with an input signal from the delay circuit 42 being applied to the clock terminal CK of the flip-flop.

Although certain preferred embodiments have been shown and described, it should be understood that many changes and modifications may be made therein without departing from the scope of the appended claims.

What is claimed is:

1. A device for measuring the average frequency of a carrier wave of burst signals with a predetermined desired accuracy R, comprising:

an input terminal for receiving thereat said burst signals;

clock generator means for generating clock signals of a period Tc;

preliminary gate signal generator means connected to said input terminal for generating preliminary gate signals in response to said burst signals, each of said preliminary gate signals defining an approximate continuous counting time for each corresponding one of said burst signals;

a gate signal generating means connected to the output side of said preliminary gate signal generator means, for outputting respective synchronized gate signals;

a first gate connected to the output of said gate signal generating means for receiving therefrom said synchronized gate signals and allowing said burst signals to pass through said first gate during the respective synchronized gate signals;

a second gate connected to the output of said gate signal generating means for receiving therefrom said synchronized gate signals and allowing said clock signals to pass through said second gate during the durations of said synchronized gate signals;

a first counter means connected to the output of said first gate for counting the number F of cycles of said burst signals having passed through said first gate;

a frequency dividing means connected to the output of said second gate for receiving therethrough said clock signals and frequency-dividing them by in accordance with a preset value n which is an integer equal to or greater than 1;

setting means connected to said frequency dividing means for setting said preset value n thereinto;

a second counter means connected to the output of said frequency dividing means for counting the number K of frequency-divided clock signals from said frequency dividing means;

a third counter means connected to the output of said gate signal generating means for counting the number N of said synchronized gate signals therefrom;

gate signal control means for starting and stopping the generation of said synchronized gate signals by said gate signal generating means in response to a control signal and the output from said frequency dividing means, respectively;

frequency-division-ratio determining means for supplying said control signal to said gate signal control means, thereafter calculating a value of $(Na/R) \times (1/Tc)$ from a count Na of said third counter means at the time the first output is produced from said frequency dividing means, the accuracy R, and the period Tc of the block signals, determining $P \times 10^n$ greater than the close to said value, and supplying the n to said setting means, where P is an integer of 2 equal to or greater then;

repetition means for repeatedly supplying said control signal to said gate signal control means, picking up the count F from said first counter means each time the output is produced from said frequency dividing means, and resetting said first counter means;

a buffer memory for storing the count F from said first counter means;

calculating means for calculating an average value f of the counts F each time the count F is picked from said first counter means, based on the at most K of the most recent counts F stored in said buffer memory and a count k from said second counter means, and for determining an average frequency $f/(10^n \times Tc)$ of said input burst signals from said average value;

transition detecting means for detecting a condition in which said count k is equal to or less than $(P-1)$; and a display unit for displaying the average frequency produced by said calculating means and the condition of k is equal to or less than $(P-1)$.

2. The device of claim 1, wherein said gate signal generating means is connected to receive as an input the output of said clock generator means, and said synchronized gate signals are synchronized with said clock signals.

3. The device of claim 1, wherein said signal means is connected to said input terminal, and said synchronized gate signal are synchronized with said carrier wave of said burst signals.

4. A device for measuring an average frequency of a carrier wave of burst signals with a predetermined desired accuracy R, comprising:

an input terminal for receiving thereat said burst signals;

clock generator means for generating clock signals for a period Tc;

preliminary gate signal generator means connected to said input terminal for generating preliminary gate signals in response to said burst signals, each of said preliminary gate signal defining an approximate continuous counting time for each corresponding one of said burst signals;

a gate signal generating means connected to output sides of said preliminary gate signal generator means; for outputting sychronized gate signals corresponding to said preliminary gate signals;

a first gate connected to the output of said gate signal generating means for receiving therefrom said synchronized gate signals and allowing said burst signals to pass through said first gate during durations of the respective synchronized gate signals;

a second gate connected to the output of said gate signal generating means for receiving therefrom said synchronized gate signals and allowing said clock signals to pass through said second gate during the durations of said synchronized gate signals;

a first counter means connected to the output of said first gate for counting the number F of cycles of said burst signals having passed through said first gate;

a frequency dividing means connected to the output of said second gate for receiving there through said clock signals and frequency-dividing them by $10^n$ in accordance with a preset value n which is an integer equal to or greater than 1;

setting means connected to said frequency dividing means for setting said preset value n thereinto;

second counter means connected to the output of said frequency dividing means for counting the number K of frequency-divided clock signals from said frequency dividing means;

gate signal control means for starting and stopping the generation of said synchronized gate signals by said gate signal generating means in response to a control signal and the output from said frequency dividing means, respectively;

calculation and operation control means connected to respective said first, second counter means, said setting means and said gate signal control means, for determining said preset value n and a value p such that an average frequency obtained from P successive frequency data $F_1, F_2, \ldots F_p$ will ensure said accuracy R, for detching the count value F from said first counter means in response to the output from said frequency dividing means, storing the count value F as the frequency data in a buffer memory provided in said calculation and operation control means and calculating an average frequency f using all but not exceeding P of the most current frequency data $F_1, F_2, \ldots F_0$ stored in said buffer memory, and for resetting said first counter means and supplying said control signal to said gate signal control means, thereby starting the next measurement; and display means connected to said calculation and operation control means for receiving and displaying the average frequency.

5. The device of claim 1, said gate signal generating means being connected to said clock generator means, and said synchronized gate signals being synchronized with said clock signals.

6. The device of claim 4, said signal means being connected to said input terminal, and said synchronized gate signals being synchronized with said carrier wave of said burst signals.

7. A device according to claim 1, further including measurement accuracy setting means for externally setting said desired accuracy R, and means for determining the smallest integer value n' which satisfies $1/(R \times Tc)$ being less than $10^{n'}$ and for applying said n' to said setting unit so that said frequency divider divides by $10^{n'}$ for the time said count Na is obtained.

8. A device according to claim 7, wherein, after the count k of said second counter means reaches P, said calculating means equalizes k to P.

9. A device according to claim 8, wherein said buffer memory erases the oldest of the counts F therefrom and stores the latest P of the counts F each time the output is produced from said frequency dividing means.

10. A device according to claim 8, further including means for detecting when a cumulated variation in the last P−1 values of the count F from said first counter circuit, with respect to the respective average value f, is below a predetermined value, said display unit including a display section for displaying a respective condition for indicating that said variation is below said predetermined value.

11. A device according to claim 8, wherein said second counter means comprises a second counter circuit to count said number of outputs k, and the count k of said second counter circuit is read by said calculating means each time the output is produced from said frequency dividing means, for determining whether said average value f satisfies said desired accuracy R.

12. A device according to claim 8, wherein said frequency-division-ratio determining means, said repetition means, said calculating means, said transition detecting means, and said second counter means are constructed of a microcomputer.

13. A device according to claim 8, wherein said repetition means includes means for resetting said third counter circuit each time said first counter circuit is reset, and further including means responsive to each output from said frequency dividing means for picking up the count N from said third counter circuit, for comparing the count N with a number corresponding to the count Na in said frequency-division-ratio determining means, for controlling the storage of the count F into said buffer memory and operation of said calculating means when the counts N and Na are substantially equal to each other, and for controlling operation of said frequency-division-ratio determining means again when the count N is not substantially equal to said number corresponding to the count Na.

14. A device for determining a value corresponding to the frequency of at least a portion of a signal that is repeated, comprising:

clock means for providing a clock signal having clock pulses;

first means, operatively connected to receive said clock signal and said frequency signal, for counting a number F corresponding to the number of periods of the frequency during said portion of said signal, for counting the number Ta of clock pulses during said portion of said signal, and for restarting said counting when said number Ta reaches a predetermined value, and second means, operatively connected to said first means, for storing a plurality of the counted number F, for calculating, using the plurality of the counted number F, a cumulative value f corresponding to said frequency of said portion of said signal, and for providing a first output corresponding to the current value of said cumulative value of f and a second output indicating when said cumulative value of f has reached a predetermined accuracy R.

15. The device of claim 14, wherein said first means provides a synchronized gate signal for determining said portion of each said frequency signal for said counting of said number F, and counts the number of said synchronized gate signals, and said second means controls said first means to count the number Na of said synchronized gate signals and said clock pulses during an initial period for determining said predetermined value for said counting of Ta, and for determining the number of times said recommencing of said counting is to be provided before said further output is provided indicating that said cumulative value f has achieved at least said predetermined accuracy R.

16. The device of claim 15, wherein said counting during said initial period is to effectively determine the period $\tau$ of each said synchronized gate signal.

17. The device of claim 14, comprising
said first means including:

receiver means for receiving said frequency signal and for providing a respective output corresponding to the amplitude of said frequency signal;

a clock for outputting said clock signal;

gate signal means for generating a gate signal for defining said portion of each said frequency signal for said counting of said numbers F and Ta;

first and second counters for counting said clock pulses and a signal corresponding to said output of said receiver means, respectively, during said gate signals, to provide the respective count value F; and comparison means for comparing a preset count value with the count value of said first counter of said clock pulses, and for providing a respective output when the count value is equal to said preset count value, whereby said preset value determines the number of repetitions of said frequency signal for each said counting of said number F; and said second means including control means for receiving the output of said comparison means, for controlling said recommencing of said counting by said first means, for counting the outputs of said comparison means, and for comparing the respective counted value thereof with a respective preset count value to determine when said current value of the cumulative value f has an accuracy of at least said predetermined value R;

wherein each said gate signal is synchronized with a predetermined one of the pulses counted by said first and second counters.

18. The device of claim 17, wherein said repeated frequency signal is a burst signal of a carrier frequency, each said gate signal has a width determined by the width of the burst signal, and each said gate signal is synchronized to begin and end in phase with said clock pulse as counted by said first counter.

19. The device of claim 17, said receiver means including means for delaying said output thereof, wherein said repeated frequency signal is a burst signal of a carrier frequency, each said gate signal has a width that is determined by the width of said burst signal, and each said gate signal is synchronized to begin and end in phase with said delayed output of said receiver means.

20. The device of claim 17, wherein said counting of said clock pulses and of said output of said receiver means is provided with a relative random phase for each repetition of said repeated frequency signal, and each said gate signal has a width determined by the width of each said repeated frequency signal.

21. The device of claim 15, wherein a limit of each said counting of said clock pulses is according to $Ta = 10^n$, where n is a positive non-zero integer.

22. The device of claim 21, wherein for said counting of clock pulses during the initial period n is set to n' so that $1/RTc < 10^{n'}$, where Tc is the period of said clock pulses, and for each subsequent counting thereof n is set so that a net counting period, after said initial period and before said output indicating said cumulative value f has at least said accuracy R, is given by $Na/(RTc) \times P10^n$, wherein P is an integer equal to or greater than 2.

* * * * *

UNITED STATES PATENT AND TRADEMARK OFFICE
CERTIFICATE OF CORRECTION

PATENT NO. : 4,680,540
DATED : July 14, 1987
INVENTOR(S) : Shoji Niki; Toshiro Takahashi; and Yohei Hirakoso It is certified that error appears in the above-identified patent and that said Letters Patent is hereby corrected as shown below:

Col. 1, line 16 "if" should be --is--.

Col. 3, line 2 "Na/R (RxTc)" should be -- Na/(RxTc)--.

Col. 3, line 35 "(f)" should be --"f"--.

Col. 8, line 66 "$1 \times 10^{-4}$" should be --$1 \times 10^{-r}$--.

Col. 10, line 51 "thriough" should be --through--.

Col. 11, line 1 "Ta/Naτ" should be --Ta/Na≠τ/Tc--.

Col. 11, line 2 "$(1/\tau/Tc)(1/R)^2$" should be --$(1/\tau)(1/R)^2$--.

Col. 11, line 22 "dealy" should be --delay--.

Col. 12, line 46 "then" should be --than--.

Col. 16, line 52 "Na/(RTc)xP10$^n$," should be --Na/(RTc) ≦ P10$^n$,--.

Signed and Sealed this

Second Day of February, 1988

*Attest:*

DONALD J. QUIGG

*Attesting Officer*  *Commissioner of Patents and Trademarks*